United States Patent [19]

Kitagawa

[11] Patent Number: 4,595,185

[45] Date of Patent: Jun. 17, 1986

[54] FIXING APPLIANCE

[75] Inventor: Hiroji Kitagawa, Nagoya, Japan

[73] Assignee: Kitagawa Industries Co., Ltd., Nagoya, Japan

[21] Appl. No.: 631,312

[22] Filed: Jul. 16, 1984

[30] Foreign Application Priority Data

Jul. 19, 1983 [JP] Japan .......................... 58-112023[U]

[51] Int. Cl.$^4$ .......................................... H01R 13/54
[52] U.S. Cl. ...................................... 269/43; 269/48.1; 269/903; 269/50; 29/281.1
[58] Field of Search .................. 248/681, 69, 73, 74.2; 339/17 LM, 17 M, 17 N, 4; 324/73 PC; 269/47, 50, 48.1, 43, 55, 254 R, 903; 29/281.1, 281.4, 281.5

[56] References Cited

U.S. PATENT DOCUMENTS 3,701,071 10/1972 Landman ............................... 339/4
4,457,482 7/1984 Kitagawa ............................. 248/73

Primary Examiner—Robert C. Watson

Attorney, Agent, or Firm—Oblon, Fisher, Spivak, McClelland & Maier

[57] ABSTRACT

A fixing appliance according to the present invention includes a base plate one end portion of which is bent to the surface side to form an upstand portion of predetermined certain height, a first substrate mounting portion contiguous to the upstand portion tiltably through a flexible thin-wall portion formed at a fore end part of the upstand portion, and a second substrate mounting portion contiguous to the other end portion of the base plate tiltably through a flexible thin-wall portion formed at this other end portion, the fixing appliance further including a fixing mechanism which is provided on the back of the base plate and which can fix the base plate to a stationary member, and mounting mechanisms which are provided on the first and second substrate mounting portions and which permit mounting of substrates to those substrate mounting portions. Thus, in the present invention, the space between the substrates can be enlarged by opening both substrates, whereby the operation for inspection and repair of the substrates and that for mounting electric wires between the substrates can be done easily and efficiently.

8 Claims, 11 Drawing Figures

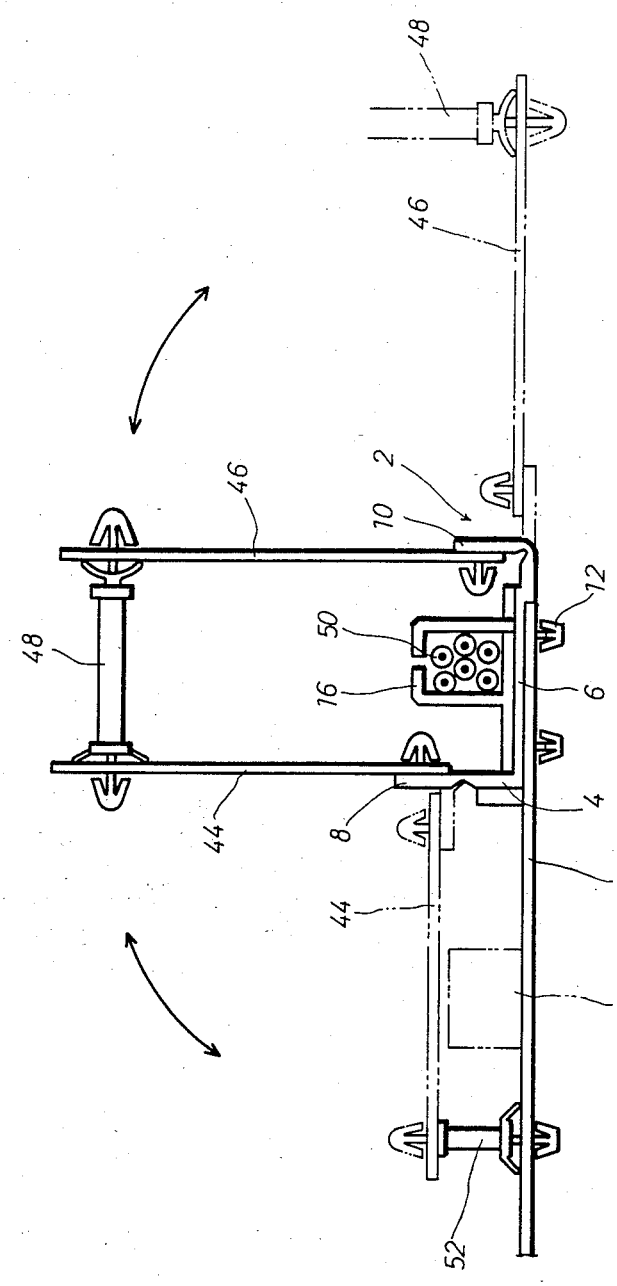

FIXING APPLIANCE

BACKGROUND OF THE INVENTION (1) Field of Art

The present invention relates to an appliance for fixing substrates for electronic devices and more particularly to a fixing appliance which permits two substrates to be attached thereto tiltably.

(2) Prior Art

In electronic devices, it is in many cases necessary for two substrates to be fixed in parallel and spaced relation to each other. However, there is a recent tendency to make the inter-substrate spacing as small as possible; besides, the substrates are each fixed, and so the space between both substrates is very narrow. Consequently, it is very difficult to perform operations for electric wiring or for inspection and repair between the substrates, and thus the working efficiency is not good.

SUMMARY OF THE INVENTION

The present invention has been accomplished in view of the above-mentioned circumstances, and it is the object thereof to provide a substrate fixing appliance which permits two substrates to be attached thereto so that the substrates can be opened and closed and in which operations for electric wiring and for inspection and repair between the substrates can be done easily by opening both substrates.

The gist of the present invention which has been effected in order to attain such object resides in a substrate fixing appliance including a base plate, one end portion of which is bent to the surface side to form an upstand portion of a predetermined height, a first substrate mounting portion contiguous to the upstand portion and tiltable via a flexible thin-wall portion formed at a fore end part of the upstand portion, and a second substrate mounting portion contiguous to the other end portion of the base plate and tiltable via a flexible thin-wall portion formed at this other end portion, the substrate fixing appliance further including a fixing mechanism which is provided on the back of the base plate and which permits fixing of the base plate to a stationary member, and mounting mechanisms which are provided on the first and second substrate mounting portions and which permit mounting of substrates to those substrate mounting portions.

Thus, according to the present invention, since the first and second substrate mounting portions are contiguous, and tiltable through the flexible thin-wall portions, to both end portions of the base plate which can be fixed through the fixing mechanism to a stationary member such as a chassis or the like, substrates once attached to both mounting portions also become tiltable. Consequently, even where the spacing between both substrates is kept very narrow during use, operations for electrical wiring and for inspection and repair between the substrates can be done easily by opening both substrates, thereby permitting improvement of the working efficiency. Further, since the upstand portion of a predetermined certain height is provided at one end portion of the base plate and the first substrate mounting portion is contiguous to a fore end part of the upstand portion, a chassis or the like would not impede the opening and closing motions of the substrate as long as those electric parts are not projecting beyond the upstand portion, and thus the substrates can be fully opened, thereby permitting the above operations to be performed without any trouble.

BRIEF DESCRIPTION OF THE DRAWINGS

FIGS. 10 and 11 are front views showing different conditions of use in the same embodiment.

DESCRIPTION OF A PREFERRED EMBODIMENT

An embodiment of the present invention will be described in detail hereinunder with reference to the accompanying drawings.

Figure 1:
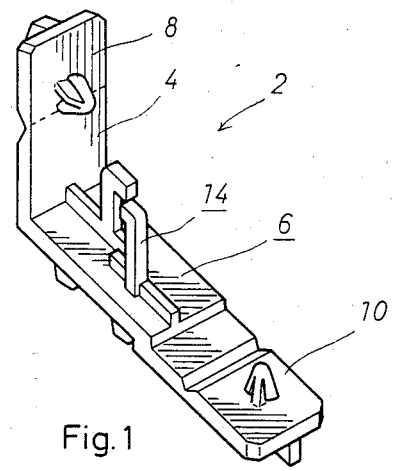
FIG. 1 is a perspective view illustrating an embodiment of the present invention.
Figure 2:
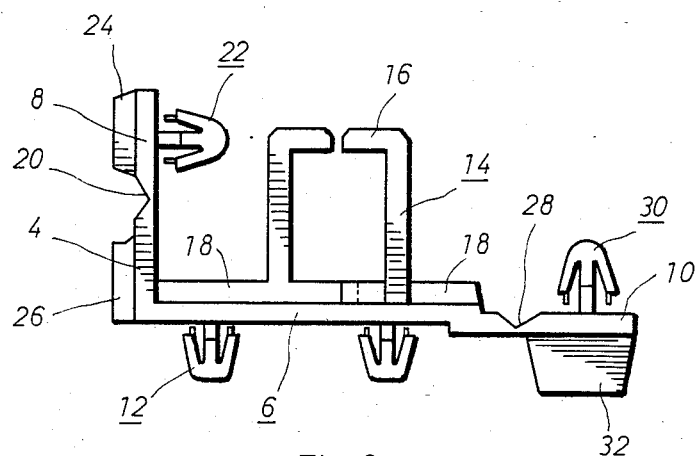
FIG. 2 is a front view thereof.
Figure 3:
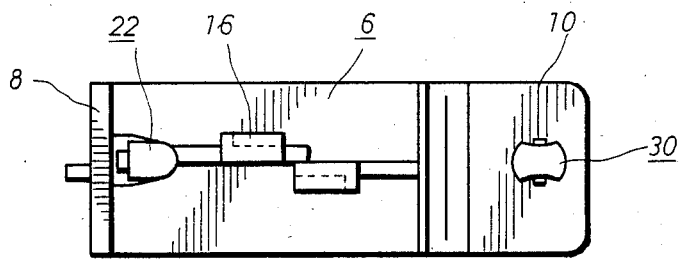
FIG. 3 is a plan view thereof.
Figure 4:
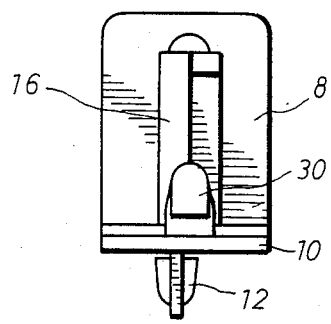
FIG. 4 is a right side view thereof.

In FIG. 1, a fixing appliance 2 includes a first substrate mounting portion 8 and a second substrate mounting portion 10 which are tiltably contiguous to both end portions of a base plate 6 having an upstand portion 4. The fixing appliance 2 is integrally formed of a synthetic resin (polypropylene in this embodiment).

As shown in FIGS. 1 through 4, the base plate 6 comprises a plate member of a certain width, and one end portion thereof is bent perpendicularly to the surface to form the upstand portion 4 of a certain height. On the back of the base plate 6 is provided a retaining portion 12 serving as a fixing mechanism which can fix the base plate to a stationary member such as a chassis or the like, while on the surface side there are provided a pair of L-shaped electric wire holding portions 14. The electric wire holding portions 14 are disposed so that they are offset from each other in a direction lateral to the length of the base, and the fore ends of the respective hook-like portions 16 face in directions opposite to each other. At the base portion of each electric wire holding portion 14 is formed a rib 18 in the longitudinal direction of the base plate 6 to reinforce the electric wire holding portions 14 and the base plate 6.

At a fore end part of the upstand portion 4 is formed a flexible thin-wall portion 20 and the first substrate mounting portion 8 is contiguous to the said fore end part and tiltable via the flexible thin-wall portion 20. On the surface side of the mounting portion 8 is provided a retaining portion 22 which serves as a substrate mounting mechanism, while on the back side thereof and the back side of the upstand portion 4 are provided ribs 24 and 26 repectively for reinforcement.

The other end portion of the base plate 6 extends in a stepped fashion, and at a fore end part thereof is formed a flexible thin-wall portion 28. Through this flexible thin-wall portion 28 the second substrate mounting portion 10 is contiguous to the other end portion of the base plate 6. On the surface side of the mounting portion 10 is provided a retaining portion 30 which serves as a substrate mounting mechanism, while on the back side thereof is formed a rib 32.

Figures 5, 6:
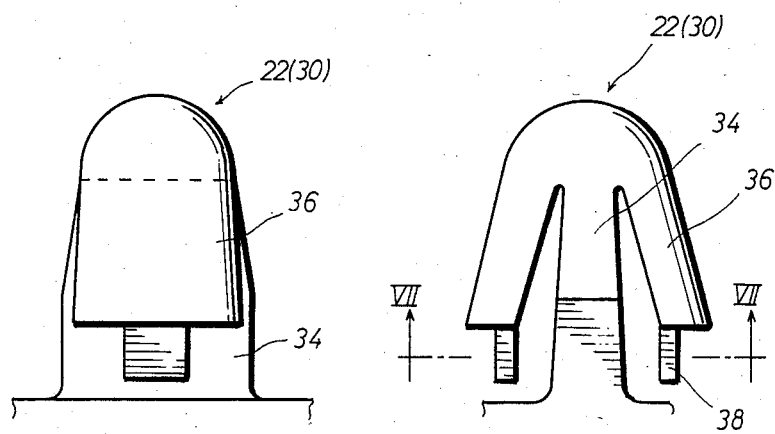
FIG. 5 is an enlarged front view of a portion thereof.
FIG. 6 is an enlarged side view thereof.
Figure 7:
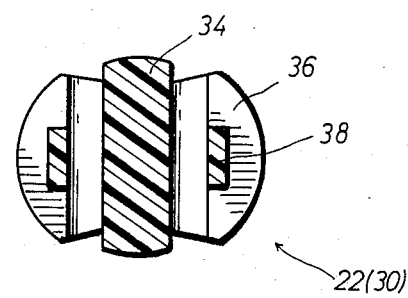
FIG. 7 is a sectional view taken on line VII—VII of FIG. 5.
Figure 9:
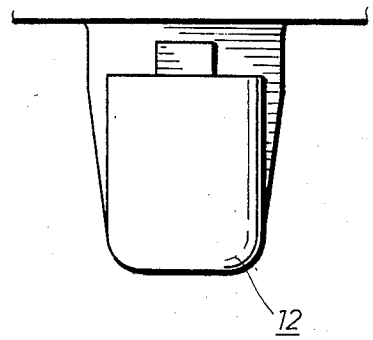
FIG. 9 is an enlarged side view thereof.
Figure 8:
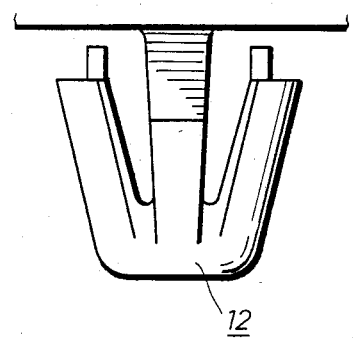
FIG. 8 is an enlarged front view of another portion in the same embodiment.

The retaining portions 22 and 30, as shown enlargedly in FIGS. 5 and 7, are each composed of a connection plate 34, a pair of elastic hook pieces 36 integrally formed at the fore end portion of the connection plate 34 so as to be deformable elastically in a lateral direction, and retaining projections 38 each projecting from an open side end face of each elastic hook piece 36. The elastic hook pieces 36 once inserted in a fixing hole of a substrate expand, so that its end faces hook the portion around the fixing hole, and the retaining projections 38 expand within the fixing hole, whereby the substrate can be mounted. The retaining portion 12 is also constituted similarly as shown in FIGS. 8 and 9.

Figure 10:
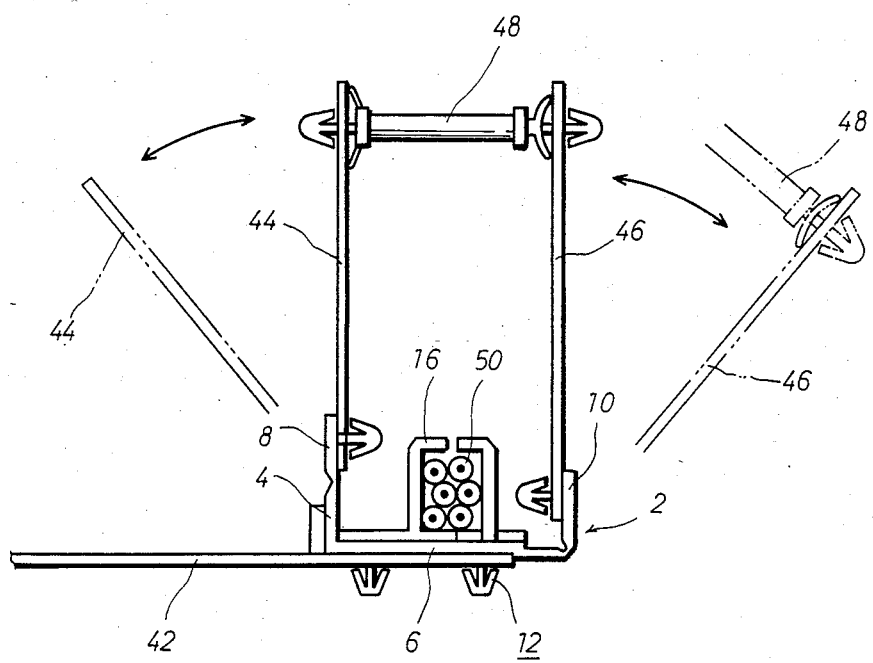

The fixing appliance constructed as above is used, for example, as shown in FIG. 10, in which the fixing appliance 2 is mounted on a chassis 42, and substrates 44 and 46 are attached to the fixing appliance 2. End portions of the substrates 44 and 46 are supported by a fixing means 48 and both substrates 44 and 46 are held in parallel with each other. The fixing appliance is mounted usually in plural numbers (two in this embodiment) in the direction orthogonal to the paper surface of FIG. 10. By disengaging an end portion of the fixing means 48 from one substrate and opening both substrates as shown in alternate long and two short dashes line, the space between the substrates becomes wider, thus facilitating operations for inspection and repair of the substrates and for mounting electric wires 50 into the electric wire holding portions 14, whereby the efficiency of these operations can be improved.

Further, the substrate 44 thus opened can be held horizontally through a fixing means 52 attached to the chassis 42 as shown in FIG. 11, whereby the operations for inspection and repair of the substrate and for mounting electric wires can be done more easily than in the case of holding the substrate by hand. Moreover, since the substrate 44 is attached to the first substrate mounting portion 8 which is contiguous to the fore end of the upstand portion 4 having a predetermined certain height, it can be held in place even when there is an electric part 54 or other projection on the chassis 42.

As the retaining portions serving as substrate mounting mechanisms in the above embodiment, there may be adopted other types of retaining means usually employed. Moreover, upstand portions may be provided at both end portions of the base plate 6.

An embodiment of the present invention has been described above, but it goes without saying that the invention is not limited thereto and that various modifications may be made within the scope not departing from the gist of the invention.

As set forth hereinabove since the fixing appliance of the present invention is so constructed as to permit two substrates to be attached thereto so that the substrates can be opened and closed. the space between both substrates can be enlarged by opening the substrates, and consequently the operation for inspection and repair of the substrates and that for mounting electric wires between the substrates can be done easily and efficiently. Besides, the base plate which is fixed to a stationary member such as a chassis or the like is provided at one end portion thereof with the upstand portion of a certain height and the first substrate mounting portion permits a substrate to be attached thereto, so even when an electric part or other projection so present on the chassis, the substrate can be opened without interference therewith, whereby the foregoing inspecting and other operations can be done efficiently.

What is claimed is:

1. A fixing appliance comprising:
    (a) a base plate having one end portion thereof bent toward an upper surface thereof to form an upstand portion of a predetermined height;
    (b) a first substrate mounting portion for a first substrate being contiguous to a free end portion of said upstand portion and being tiltably fixed thereto via a first flexible thin-wall portion formed at said free end portion of said upstand portion;
    (c) a second substrate mounting portion for a second substrate being contiguous to another end portion of said base plate and being tiltably fixed thereto via a second flexible thin-wall portion formed at said another end portion;
    (d) a retaining portion provided on a lower surface of said base plate, said retaining portion having means for connecting to a fixing member;
    (e) a first retaining means provided on said first substrate mounting portion and a second retaining means provided on said second substrate mounting portion, said first and second retaining means each having a connection plate extending from a respective one of said first and second substrate mounting portions and each having at least one elastic hook piece elastically deformable in a lateral direction and extending from a free end portion of a respective one of said connection plates toward one of said substrate mounting portions, and a retaining projection connected to an open end face of each said elastic hook piece respectively, whereby said first and second retaining means may expand by virtue of the elasticity thereof and retain a respective said substrate after being inserted into a fixing hole thereof.

2. A fixing appliance as set forth in claim 1, wherein said base plate, said first substrate mounting portion, said second substrate mounting portion, said first and second flexible thin-wall portions, said retaining portion, and said first and second retaining means are integrally formed of a synthetic resin.

3. A fixing appliance as set forth in claim 1, including a first rib formed on a side of said first substrate mounting portion opposite said first retaining means, a second rib formed on the side of said second substrate mounting portion opposite said second retaining means, a third rib on one side of said upstand portion and a fourth rib on said upper side of said base plate.

4. A fixing appliance as set forth in claim 1, including another upstand portion provided between said base plate and said second thin-wall portion.

5. A fixing appliance comprising:
    (a) a base plate having one end portion thereof bent toward an upper suface thereof to form an upstand portion of a predetermined height;
    (b) a first substrate mounting portion for a first substrate being contiguous to a free end portion of said upstand portion and being tiltably fixed thereto via a first flexible thin-wall portion formed at said free end portion of said upstand portion;
    (c) a second substrate mounting portion for a second substrate being contiguous to another end portion of said base plate and being tiltably fixed thereto via a second flexible thin-wall portion formed at said another end portion;
    (d) a retaining portion provided on a lower surface of said base plate, said retaining portion having means for connecting to a fixing member;
    (e) a first retaining means provided on said first substrate mounting portion and a second retaining means provided on said second substrate mounting portion, said first and second retaining means being expandable by virtue of the elasticity thereof so as to retain a respective said substrate after being inserted into a fixing hole thereof; and (f) a plurality of electric wire holding portions extending from said upper surface of said base plate, free ends of said holding portions facing opposite each other.

6. A fixing appliance as set forth in claim 5, wherein said electric wire holding portions are offset from each other in a direction lateral to a line connecting said ends of said base plate.

7. The fixing appliance of claim 5 in combination with said first and second substrates, and with a fixing means connectable to said substrates to retain the position of said substrates when said substrates are positioned parallel to one another and normal to said base plate.

8. The fixing appliance of claim 5 in combination with said first and second substrates, and with a fixing means connectable betwen said fixing member and said first substrate when said first substrate is positioned parallel to said base plate.

* * * * *